United States Patent
Bugaris et al.

(10) Patent No.: US 11,709,187 B2
(45) Date of Patent: Jul. 25, 2023

(54) METHODS TO INITIATE THE ABSENCE OF VOLTAGE TEST OVER A NETWORK REMOTELY

(71) Applicant: Panduit Corp., Tinley Park, IL (US)

(72) Inventors: Rachel M. Bugaris, Lexington, KY (US); Michael J. Ellis, Minooka, IL (US); Donald L. Wallace, Homer Glen, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 17/392,750

(22) Filed: Aug. 3, 2021

(65) Prior Publication Data

US 2022/0299547 A1  Sep. 22, 2022

Related U.S. Application Data

(60) Provisional application No. 63/185,545, filed on May 7, 2021, provisional application No. 63/163,297, filed on Mar. 19, 2021.

(51) Int. Cl.
  *G01R 19/155* (2006.01)
  *G01R 31/327* (2006.01)
(52) U.S. Cl.
  CPC ....... *G01R 19/155* (2013.01); *G01R 31/3275* (2013.01)
(58) Field of Classification Search
  CPC .......................... G01R 31/3275; G01R 19/155
  USPC ...................................................... 324/76.11
  See application file for complete search history.

(56) References Cited

U.S. PATENT DOCUMENTS

| | | | |
|---|---|---|---|
| 6,747,368 B2* | 6/2004 | Jarrett, Jr. | H02J 9/06 307/31 |
| 9,500,680 B2* | 11/2016 | Lachmund | G01R 19/165 |
| 10,901,013 B2* | 1/2021 | Bollman | G01R 19/155 |
| 11,137,422 B2* | 10/2021 | Guy | G01R 15/148 |
| 11,215,646 B2* | 1/2022 | Balid | G01R 15/26 |
| 2003/0042794 A1* | 3/2003 | Jarrett, Jr. | H02J 9/06 307/23 |
| 2010/0033190 A1* | 2/2010 | Devine | G01R 19/145 324/537 |

(Continued)

FOREIGN PATENT DOCUMENTS

| | | | | |
|---|---|---|---|---|
| CA | 3078886 A1 | * | 10/2020 | G01R 15/26 |
| CN | 107110894 B | * | 11/2020 | G01R 19/155 |

(Continued)

OTHER PUBLICATIONS

Alexander, Jane. 'Push-of-a-Button' Panduit VeriSafeAbsence of Voltage Tester BoostsSafety, Productivity. Nov. 11, 2016. https://www.efficientplantmag.com/2016/11/push-button-panduit-verisafe-absence-voltage-tester-boosts-safety-productivity/ (Year: 2016).*

(Continued)

*Primary Examiner* — Jermele M Hollington
*Assistant Examiner* — Sean Curtis
(74) *Attorney, Agent, or Firm* — Christopher S. Clancy; James H. Williams; Christopher K. Marlow

(57) ABSTRACT

An absence of voltage detection system has an isolation module connected to a voltage source to be detected an I/O accessory module connected to the isolation module wherein the I/O accessory module is configured to allow remote activation of the isolation module.

4 Claims, 15 Drawing Sheets

(56) References Cited

U.S. PATENT DOCUMENTS

| | | | |
|---|---|---|---|
| 2010/0070100 A1* | 3/2010 | Finlinson | G06F 1/266 |
| | | | 700/295 |
| 2012/0078546 A1* | 3/2012 | Mancuso | G01R 19/155 |
| | | | 702/61 |
| 2015/0048814 A1* | 2/2015 | Bugaris | G01R 19/0084 |
| | | | 324/76.11 |
| 2015/0192623 A1 | 7/2015 | Lachmund et al. | |
| 2017/0269128 A1* | 9/2017 | Bugaris | G01R 19/155 |
| 2019/0391186 A1* | 12/2019 | Bollman | G01R 15/144 |
| 2020/0182911 A1* | 6/2020 | Guy | G01R 29/0878 |
| 2020/0284826 A1* | 9/2020 | Savarda | G01R 22/066 |
| 2020/0284827 A1* | 9/2020 | Curry | G01R 11/24 |
| 2020/0348343 A1* | 11/2020 | Balid | G01R 31/66 |
| 2020/0408812 A1* | 12/2020 | Bugaris | G01R 19/155 |
| 2021/0285986 A1* | 9/2021 | Blanton | G01R 13/40 |
| 2022/0018903 A1* | 1/2022 | Bugaris | G01R 19/155 |
| 2022/0026467 A1* | 1/2022 | Guy | G01R 19/155 |
| 2022/0120790 A1* | 4/2022 | Balid | G01R 31/54 |
| 2022/0299547 A1* | 9/2022 | Bugaris | G01R 31/3275 |

FOREIGN PATENT DOCUMENTS

| | | | | |
|---|---|---|---|---|
| EP | 2491569 B1 * | 8/2020 | | G05B 9/02 |
| EP | 3734311 A1 * | 11/2020 | | G01R 15/26 |
| EP | 4060843 A1 * | 9/2022 | | G01R 19/155 |
| JP | 4316243 B2 * | 8/2009 | | |
| WO | 2011047428 A1 | 4/2011 | | |
| WO | WO-2011047428 A1 * | 4/2011 | | G05B 9/02 |
| WO | 2015095216 A1 | 6/2015 | | |
| WO | WO-2016036952 A1 * | 3/2016 | | G01R 19/155 |
| WO | WO-2018053386 A1 * | 3/2018 | | G01R 13/40 |
| WO | WO-2020117818 A1 * | 6/2020 | | G01R 15/148 |
| WO | WO-2020181042 A1 * | 9/2020 | | G01R 11/24 |
| WO | WO-2020181044 A1 * | 9/2020 | | G01D 4/004 |
| WO | 2021025873 A1 | 2/2021 | | |
| WO | WO-2021025873 A1 * | 2/2021 | | G01R 19/155 |

OTHER PUBLICATIONS

Panduit. Verisafe HAZ-LOC Absence of Voltage Tester. Drawing #: 181216AG_DC. May 9, 2018 (Year: 2018).*

Bugaris, Rachel. How to test for absence of voltage. May 21, 2021. https://www.plantengineering.com/articles/how-to-test-for-absence-of-voltage/ (Year: 2021).*

Giovino, Bill. How to Use Absence of Voltage Testers During Maintenance to Protect Operators from High Voltages. Jul. 15, 2021. https://www.digikey.com/en/articles/how-to-use-absence-of-voltage-testers-during-maintenance (Year: 2021).*

Panduit. VeriSafe™ Absence of Voltage Tester. © 2017 Panduit Corp. (Year: 2017).*

* cited by examiner

METHODS TO INITIATE THE ABSENCE OF VOLTAGE TEST OVER A NETWORK REMOTELY

CROSS REFERENCE TO RELATED APPLICATION(S)

This application claims benefit to U.S. Provisional Patent Application No. 63/163,297, filed on Mar. 19, 2021 and U.S. Provisional Patent Application No. 63/185,545, filed on May 7, 2021, the entirety of which is hereby incorporated by reference herein.

FIELD OF THE INVENTION

The present invention relates generally to absence of voltage detectors and more specifically to using an I/O accessory module for the remote activation of an absence of voltage detector.

BACKGROUND

There are moments when initiating an absence of voltage test in absence of voltage tester (AVT) via a system interface are advantageous, such as:
1. If there is already a Human Machine Interface (HMI) or control system, the AVT test can be integrated into the system logic automatically without need for user intervention or via user input directly at the HMI/control system interface rather than, or replacing, the AVT indicator module.
2. When there are multiple test points each monitored by a separate AVT, it may not be possible for a user to initiate each test via the push button on the individual indicator modules simultaneously in order to get all results in a given time frame to leverage the output contacts to ensure that all sources are de-energized before allowing access to an area or piece of equipment. The controller could initiate the tests significantly faster or nearly simultaneously.

SUMMARY

An absence of voltage detection system has an isolation module connected to a voltage source to be detected an I/O accessory module connected to the isolation module wherein the I/O accessory module is configured to allow remote activation of the isolation module.

DETAILED DESCRIPTION OF THE INVENTION

Figure 1:
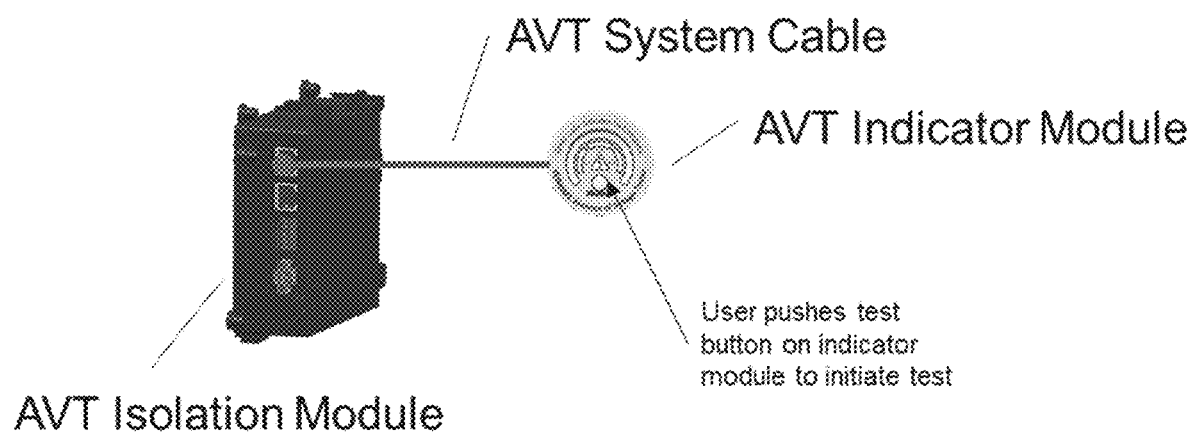
FIG. 1 shows an AVT setup with an AVT isolation module connected to an AVT indicator module.
Figure 2:
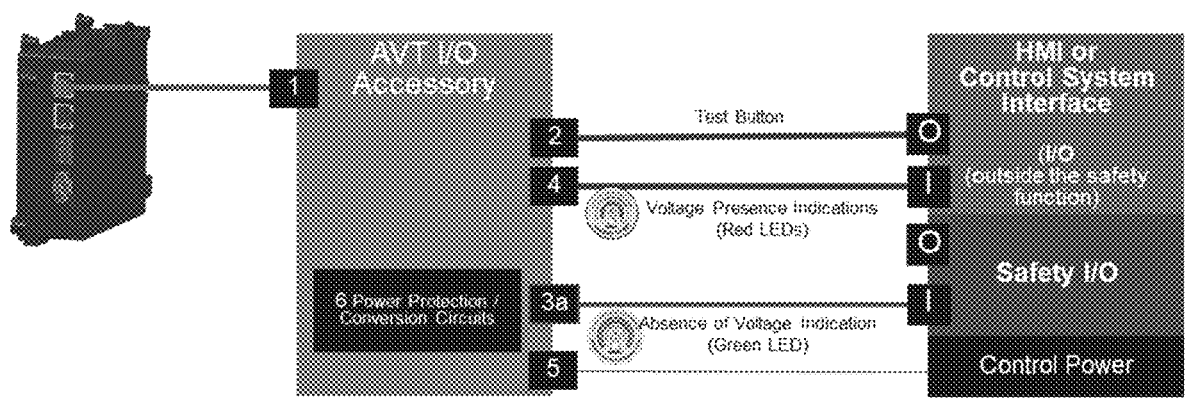
FIG. 2 shows an AVT setup with an AVT I/O accessory module wherein the safety contacts are provided on the I/O accessory module.
Figure 3:
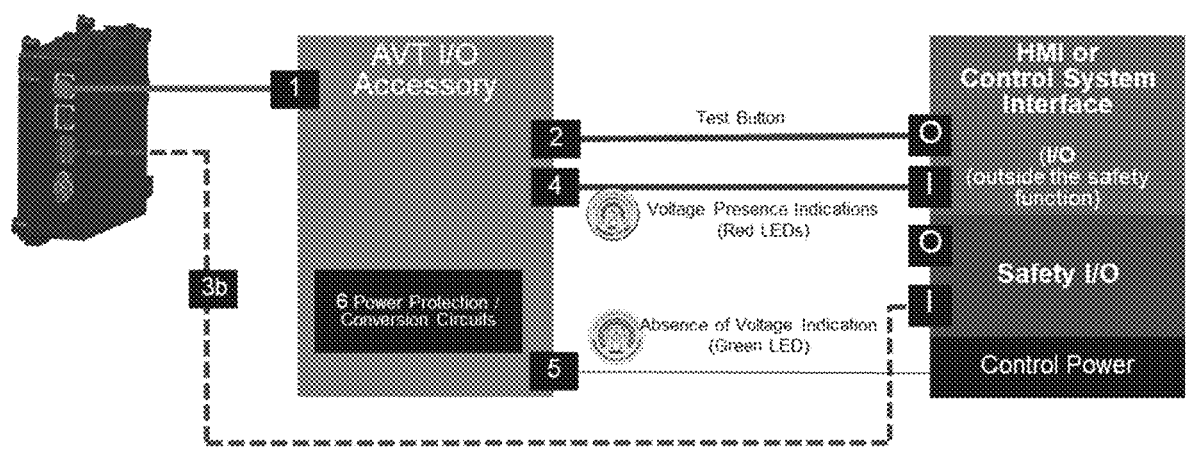
FIG. 3 shows an AVT setup wherein the safety contacts are provided on the AVT isolation module.
Figure 4:
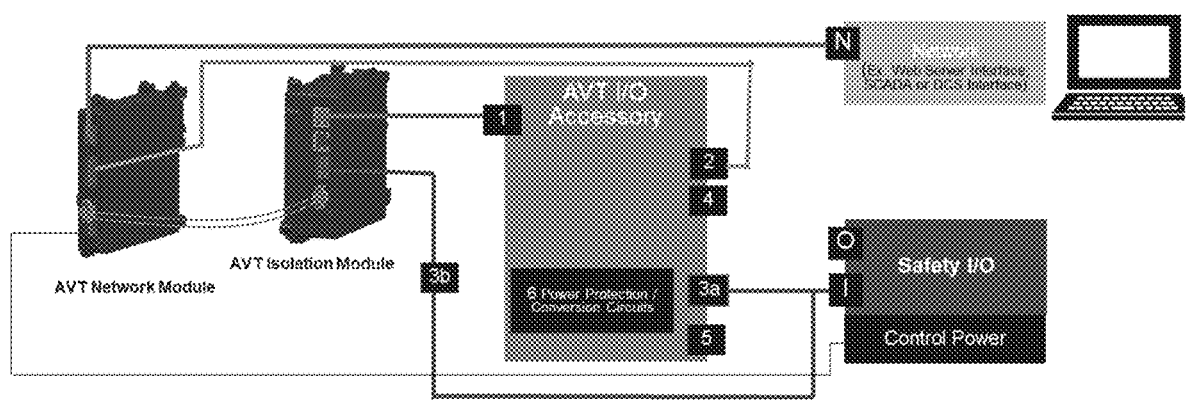
FIG. 4 shows an AVT setup that utilizes the contacts of an AVT isolation module.

Two methods according to the present invention are described herein that can be used to initiate the absence of voltage test remotely or over a network. These methods replace the indicator module from the AVT system with some other system interface. These methods include:
1. Initiating the AVT test with use of a I/O accessory module. By replacing the indicator module with an I/O Accessory Module as shown in FIGS. 2 and 3, the signals generated and sent to the AVT indicator module can be designed in a way that is compatible with an I/O rack on an HMI, PLC, or other control system interface. The I/O accessory module consists of hardware that allows communication between the AVT isolation module and control system interface. It would most likely be located close to the controller and may be outside of the enclosure where the AVT is installed.
It can consist of:
A. Input for the AVT system cable. In one embodiment, system cables can have similar construction to an ethernet cable and interface with an RJ45 jack on either end. The accessory module needs to take input from the RJ45 and output it as terminals compatible with I/O racks, PLCs, HMIs, or other control system interfaces. This connection has several wires to carry different signals.
B. An input connection for the signal to simulate the test button. This allows the AVT user to initiate the test from the control system interface or for the control system to initiate the test based on relay input or programmed logic.
C. An output for AVT test results. The absence of voltage indication is part of the safety function, therefore it can be used as an input to a safety controller. The input can be provided through a safety I/O contact on the AVT I/O accessory module [3a] (FIG. 2) or by wiring from the safety I/O output contacts directly on the AVT isolation module [3b] (FIG. 3).
D. A series of outputs for the voltage presence indications (one for each phase). This signal is not part of the safety function and utilizes standard I/O contacts. [This accomplishes the same functionality as utilizing the voltage presence output contacts on the network module if a network connection was not used, but simplifies installation and wiring, and negates the need for the network module.] By adding the solid state contacts to the accessory, it provides an option to reduce the cost and size of the base AVT by removing the solid state contacts from the isolation module. Similarly, the cost and size of the network module can be reduced by removing the solid state contacts and utilizing the I/O accessory module (See FIG. 4).

E. Input for control power (optional). Typically, the AVT will be powered by either a 3.7V battery supplying power via the system cable or 12-24V dc applied directly to the isolation module. Auxiliary input for power on the I/O accessory module provides an alternative method to power the absence of voltage test, accepting a range of control power inputs (12-48V dc, 120V ac, etc.).

An alternative to providing power to the accessory is to power the AVT by supplying optional 12-24V dc control power directly to the AVT isolation module.

F. Power protection/conversion circuits. Control systems often operate at 120V ac or 12-48V dc. Circuitry is required within the accessory module to protect the AVT isolation module from excessive control power and converting the power to an acceptable voltage level that can be supplied over the system cable. This may not be required if there is no input for control power and the power is applied directly to the AVT isolation module.

Figure 5:
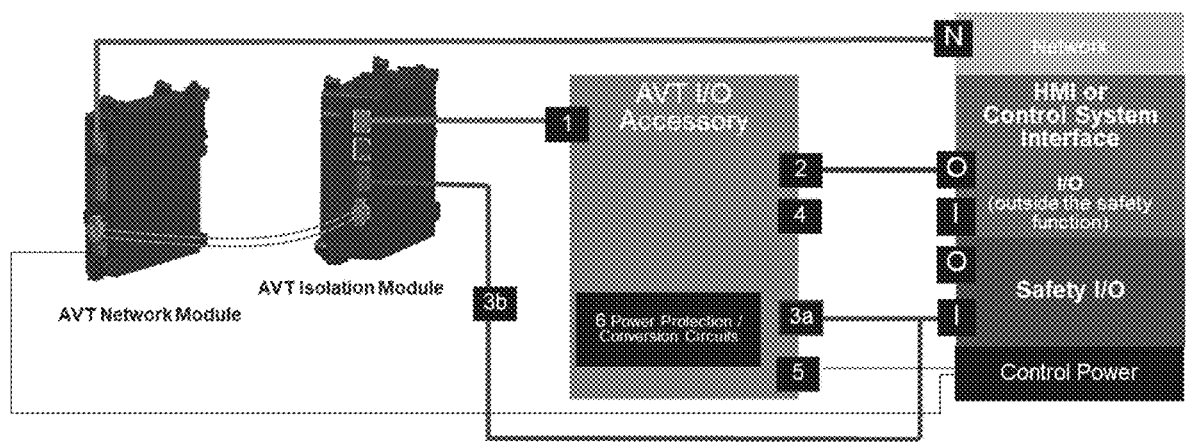
FIG. 5 shows an AVT setup wherein an AVT network module has been added.
Figure 6:
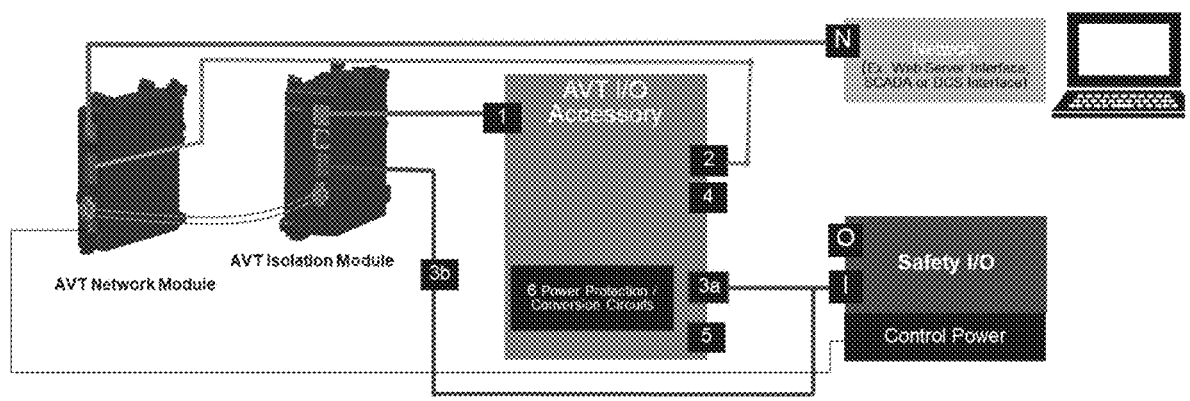
FIG. 6 shows another AVT setup where an AVT network module has been added.

2. The I/O accessory module can also be used with an AVT network module as shown in FIGS. 5 and 6. This allows for simplified connections and additional data available to the control system. In this scenario, the AVT network module is used to provide an ethernet connection between the AVT and the control system. This allows data from the AVT, including test results and status, voltage presence values, and voltage presence status to be communicated to the control system. A change in voltage presence status, or voltage values reaching a pre-determined threshold can be used to cause the control system to trigger an absence of voltage test. The network connection replaces the need for the voltage presence indication I/O to be eliminated. It also eliminates the need for control power to the I/O accessory module. This is because the network module requires either PoE or DC control power input. As in the use case without the network module, the results of the absence of voltage test that are part of the safety function can be communicated through a safety output contacts on the accessory module or via the safety output contacts on the AVT isolation module. The test results communicated to the via the network connection are for informational purposes and not part of the safety function. If the AVT is connected to a non-safety network, the network connection can still be used to log test results and timestamp for an audit trail.

FIG. 6 shows how the I/O accessory module can be used with the AVT network module to initiate the test over the network, for example via a webserver, through an enabled PLC, DCS, or SCADA system, without access to an HMI or other controls. In this embodiment, the firmware in the network module is updated to repurpose the solid state output contacts on the AVT network module. Through the web server user interface, the user can initiate an absence of voltage test. The AVT network module would trigger the test by activating the output contacts and using that to send a signal to the I/O accessory module input [2] to initiate the absence of voltage test. The results and any indications would be sent to the web server via the network connection.

The type of communication used by the network module and the application determine options for capturing the test results:

1. Network module—standard communication. If standard ethernet protocols are used, the absence of voltage indication viewed at the web server will be outside of the safety function, and would be considered a redundant indication for informational purposes. To leverage the result of the test inside the safety function, the output contacts on either the AVT Isolation Module [3b] or AVT I/O Accessory module [3a] would need to be utilized.

A. In addition, with 2.0 AVT, a second indicator could be used in the auxiliary port. This allows the AVT to still function and operate, even if the network is unavailable. The second indicator also provides a way to visually verify the test result at the work location, since any indication of absence of voltage over the network would be outside of the safety function.

B. Network module—safety communication. When safety-rated channels are used to communicate between the AVT isolation and network modules, safety communications can also be utilized through the web server. If safety protocols are used to communicate to the web server (CIP Safety, ProfiSafe, SIL 3 communications, PL d or e, etc.), the test results communicated to the web server user interface would be considered part of the safety function. This configuration would eliminate the need for additional Safety I/O [3a, 3b], or use of a second indicator module in the 2.0 AVT auxiliary port.

Figure 7:
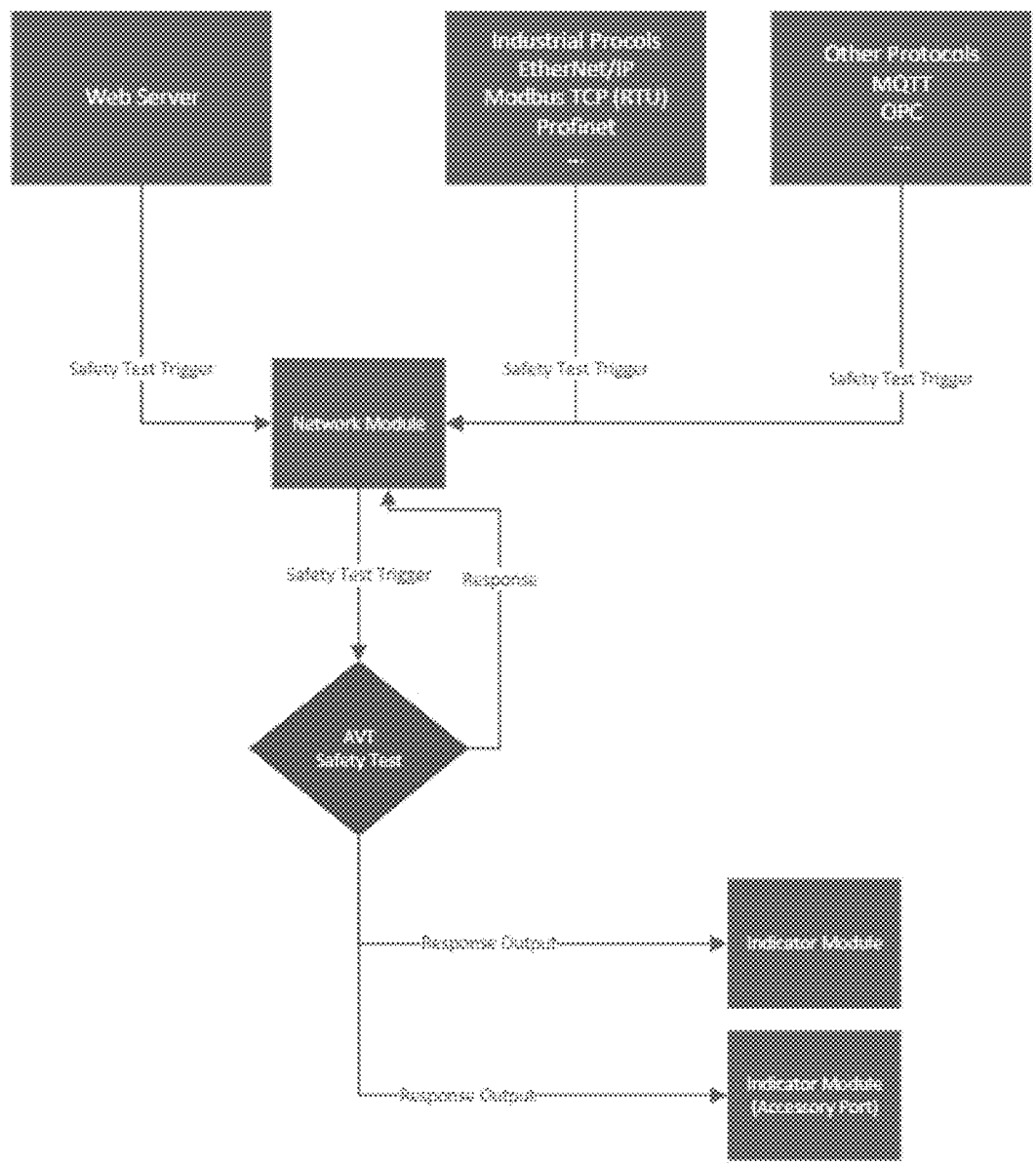
FIG. 7 shows ways in which an AVT may be activated remotely without an I/O accessory module.

2. Use of ethernet connection on network module (no accessory). The AVT network module is capable of communication with the AVT isolation module. Because of this the user is capable of using any network module supported integration methods to directly trigger the AVT isolation module to initiate the absence of voltage test, without an I/O accessory as shown in FIG. 7. This includes (but is not limited to) the use of Modbus TCP, Ethernet/IP or the onboard web application to initiate the test. The user may also use other protocols, such as MQTT, profinet or any number of protocol bridges to trigger the test. Because the system is also Bluetooth capable the system can utilize Bluetooth beacons or direct Bluetooth connections to also initiate the test. In this configuration, if standard communication protocols are used, safety rated I/O is required on the AVT to ensure the integrity of the result. However, if safety-rated communication protocols are used between the AVT isolation module, network module, and network enabled controls interface, the output contact become optional.

Initiating the absence of voltage test remotely or over a network adds new functionality to the AVT that makes it desirable to be able to adjust the timing of the absence of voltage test. Initially AVT products have been powered by batteries or ultracapacitors that have a finite amount of power. In order to conserve the power source, a user was required to initiate the test with the results being displayed for a brief period of time (approximately 5 seconds). Initiating the test begins a process that runs through the AVT safety function and results in an active visual indicator and/or changing the position of solid state contacts to communicate the results of the test depending on the status of various diagnostics and criteria. Continually running the test and diagnostics and illuminating indicators quickly drains a supply such as a battery or capacitor, shortening the useful life of the product. However, by introducing continuous power sources for the AVT test (PoE or network power, 12-48V dc power (no shock or electrical hazards)), it is now feasible to run the test or keep the indication on for longer durations. Additionally, if the user does not have to physically initiate the test at the product, the AVT can be integrated with other products and systems leading to an automated safety system.

There are several instances where it may be desirable for the user to adjust the timing, modifying the duration of the absence of increase how long the absence of voltage test takes place, especially if the test is initiated without human input. For example, consider a test cell with a single source of power. Access to the cell is controlled by a locked gate. There is a single source of power to the cell, with an AVT capable of remote/network initiation installed on the load side of the disconnect. When the disconnect is opened, power is isolated. The AVT will detect a loss of voltage on each phase. The loss of voltage triggers the control system to initiate the absence of voltage test. Alternatively, the system can be triggered to stop and start utilizing a command from an attached accessory or network module communication interface. Once the absence of voltage is verified by the AVT, the indication is given and the gate to the test cell unlocks to allow access. The AVT can continually monitor status, immediately taking action, sending a notification, or automatically relocking the gate when the disconnect is closed and voltage is detected. This is much more convenient than having to reinitiate the test every 5 seconds or only running the test once after user prompt.

When there are multiple test points each monitored by a separate AVT, it may not be physically possible for a user to initiate each test via the push button on the individual indicator modules simultaneously in order to get the results from each AVT in a given time frame to leverage the output contacts to ensure that all sources are de-energized before allowing access to an area or piece of equipment. Use of the I/O accessory module can be used to allow multiple AVTs to interface with the system, enabling the controller to initiate the tests simultaneously, collate the results, and trigger an action only if the absence of voltage is confirmed at each AVT. Depending on the configuration of the system one may also use ring (daisy chained) topology for safety outputs (added output) as opposed to a star topology in wiring the accessory outputs.

Figure 8:
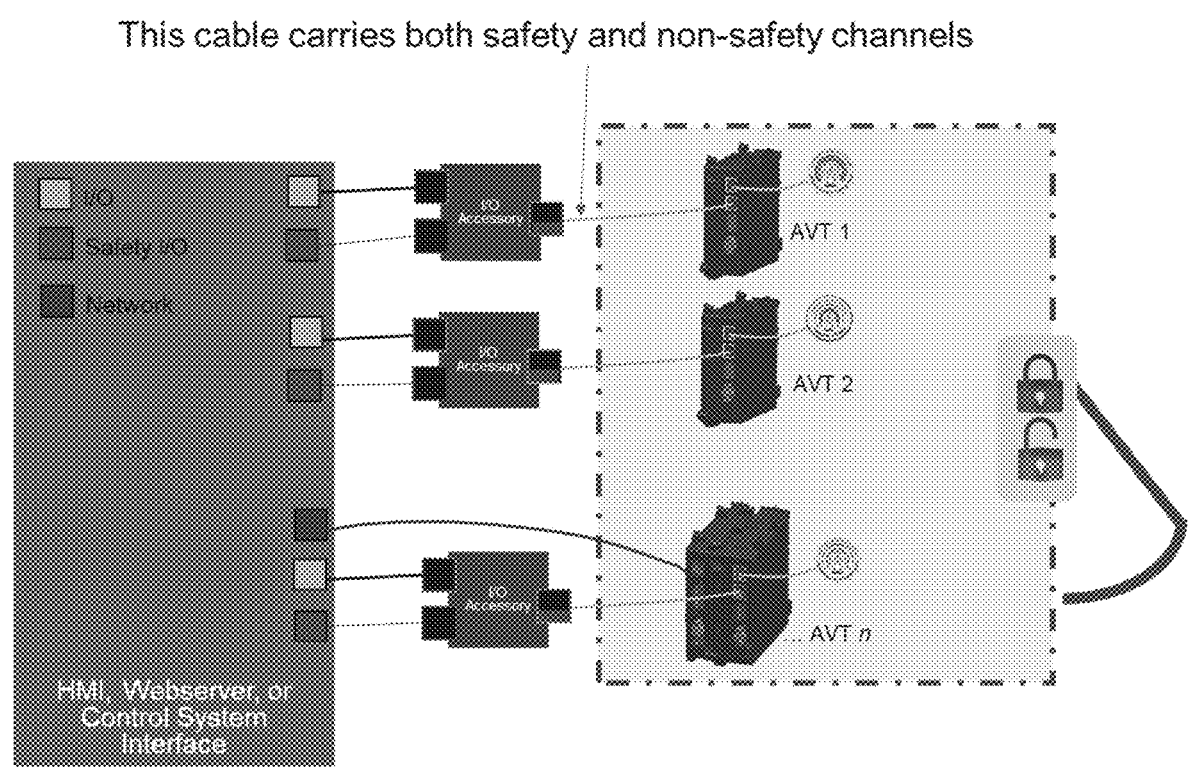
FIG. 8 shows one setup in which multiple AVTS and multiple I/O accessories may be used to test more than one location simultaneously.
Figure 9:
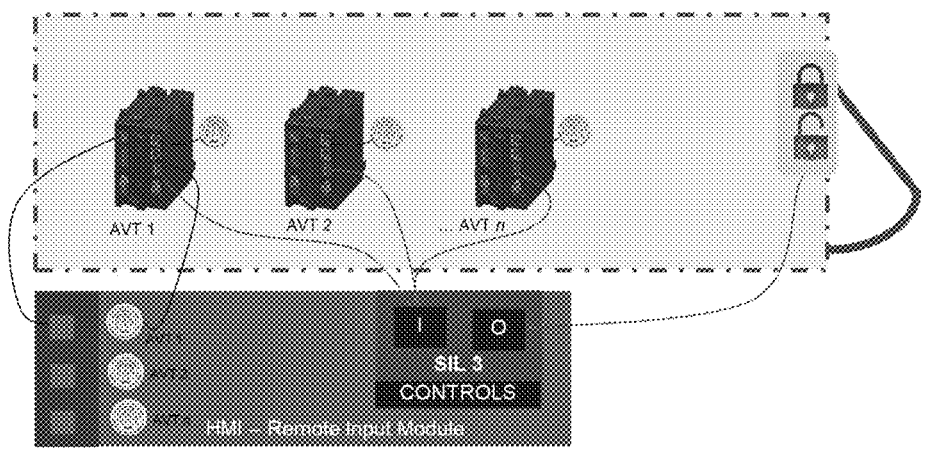
FIG. 9 shows how multiple AVTs can be coordinated by a control system to test more than one location simultaneously.

One way to achieve this is by using one accessory module for each AVT as shown in FIGS. 8 and 9. Using this method, the interface sends a signal to initiate the test to each I/O accessory which is in turn connected to an AVT. The control interface takes the inputs from each I/O accessory module to determine if a condition has been met (for example, absence of voltage at AVT1, AVT2, and AVTn). If the result at each location is satisfactory, the AVT controls can signal the result by allowing access to a room or fenced area, or triggering an on premise alert such as an audible alarm or visual stacklight, or sending a notification via text, SMS, or email.

This method can be used with or without the AVT network module. If available, additional data from the network module(s) can be integrated into the logic sequence.

Once a person is in the room, they may want to test a specific test point before or after performing work or making an adjustment. This is easily accomplished with the auxiliary indicator port on any individual 2.0 AVT.

Any time the test is initiated, whether it is by the controls or by the user via the AVT indicator module test point, the result of each test will be displayed on the local AVT auxiliary indicator. All other AVT functions, like the voltage presence indicators, will remain functional and unchanged by use of the accessory module.

Initiating testing and aggregating feedback may also be accomplished through the use of daisy chaining feedback outputs utilizing a safety bus. The initiating module (master module) can trigger downstream devices in the chain to run a test and continue the signal in the chain until it closes the loop at the master. The master then indicates a summary (anded) output for use in an external system.

An example of a typical use case is an area exists with multiple test points/voltage sources. An AVT with Network Module is installed at each source. Each AVT has an indicator module to test for voltage individually at the source. The auxiliary indicator port at each AVT is connected to an I/O Accessory Module and then to the HMI I/O rack. The HMI controls enable the absence of voltage test to be initiated simultaneously at each AVT.

The network initiates the AVT test (one button on the HMI sends a signal to each AVT, simulating the mechanical push button signal on each I/O Accessory Module in the aux port). This could be initiated by a human prompt at the HMI or by a logic condition (<3V detected on all AVT measurements via the network module or other sensor) or relay inputs. The HMI controls gather the results from each AVT. When all AVTs indicate the absence of voltage, their output contacts will change state and a signal can be sent to illuminate the "master" HMI remote imput module to communicates that all test-points are de-energized and allow access to a gated area or equipment with multiple test points.

In certain systems, the user may only want a single result based on input from multiple AVT test points. The methods in herein allow a single user interface to initiate the test and display results for multiple AVTs. An example of multiple sources of electric power inside a single electrical enclosure that may require a test is three-phase power and 120V control power or a DC bus.

Figure 10:
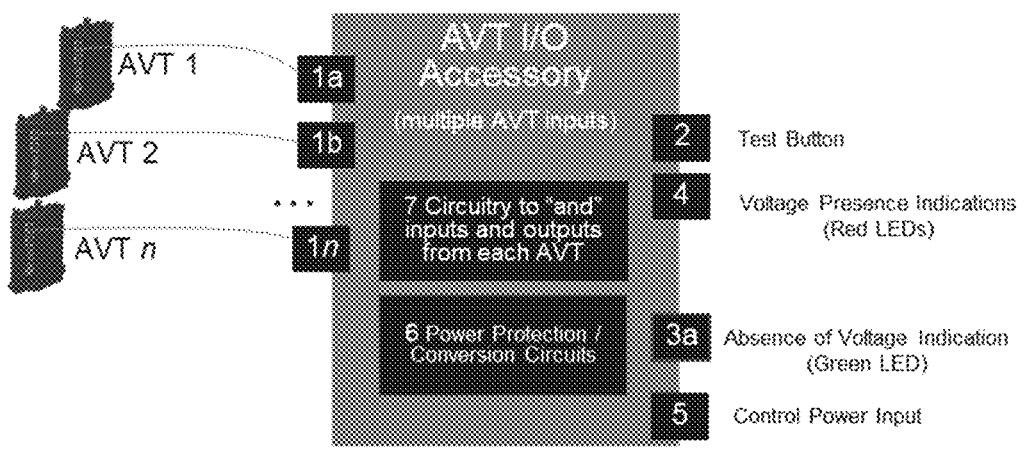
FIG. 10 shows how a single I/O accessory module can be used to control multiple AVTs.

In one embodiment, as shown in FIG. 10, this is accomplished by utilizing a single I/O accessory to determine if multiple test points are de-energized. Typical applications may be a control panel with multiple test points (multiple sources of power, 120V control power, stored energy component) or a motor control center starter with multiple test points (line side of disconnect—ensure stabs are disengaged; load side of disconnect—ensure disconnect is open; load side of contactor—verify no backfeed from the motor; DC bus/battery/capacitor—ensure no stored energy). In this embodiment, the accessory accepts inputs from more than one AVT and has additional hardware or logic to "and" each of the signals and any corresponding results.

This multiple input accessory is similar to what was previously described, except it is configured to allow connections to be made to more than one AVT [1*a*, 1*b*, . . . 1*n*], interfacing with the indicator module port on the AVT isolation module. In addition, it has circuitry [7] to perform logic, including safety functions where applicable, to each of the input/outputs. Multiple techniques could be used to accomplish this, including use of hardware based logic (for example relays, distribution block style internal connector/splitter, daisy chained contacts) or digital processor based logic, or some combination the two. The following images show examples with the signals for the test initiation and absence of voltage indication for simplicity. These are the two signals that are required at a minimum. The same methodology applies to other signals for voltage presence, and any other signals from the individual AVTs.

Figure 11:
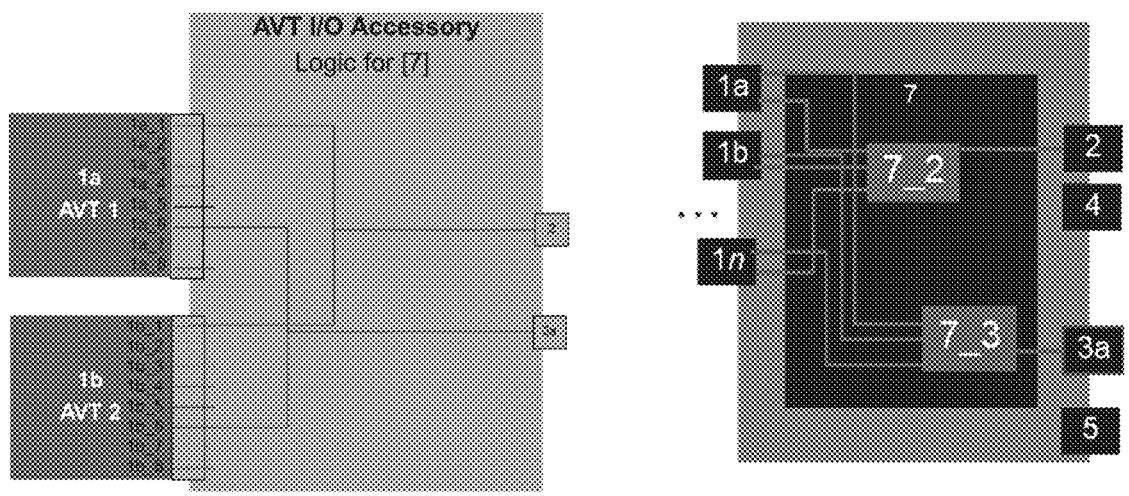
FIG. 11 shows the circuitry and logic for having a single I/O accessory module control multiple AVTs.

With the additional circuitry in [7] (as shown in FIG. 11), it is possible to simplify the connections and interface for multiple test points. For example, each input from the AVT has multiple signal wires. To initiate the test, one signal is sent from [2] and passes through logic circuitry [7_2] to the corresponding wire in [1a_1, 1b_1, . . . 1n_1] to multiple AVTs simultaneously. Similarly, in order to indicate the absence of voltage, the signal on the wire in [1a, 1b, 1n] must all activate and satisfy the logic in [7_3] before the signal will be sent from [3a] to indicate absence of voltage.

Figure 12:
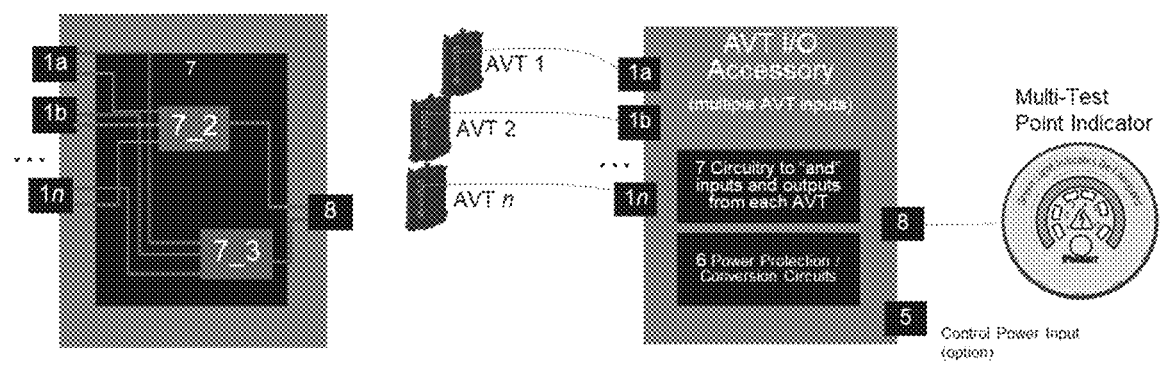
FIG. 12 shows how multiple AVTs can be used with a multi-test point indicator.

This accessory configuration shown in FIG. 11 could be used in conjunction with the HMI, web, or controls interface previously discussed, however, individual accessories for each AVT would provide the user more flexibility to configure the logic for their application. In a less complex use case, another embodiment (shown in FIG. 12) would bypass the need for the controls interface and instead rely on a multiple AVT test point indicator module. In this scenario, the logic in [7] would be fixed. An option to provide power to the AVTs by powering the accessory module from [5] could be used, or alternatively to the power input of the individual AVTs, or the multiple indicator display module [8] could supply battery power.

Figure 13:
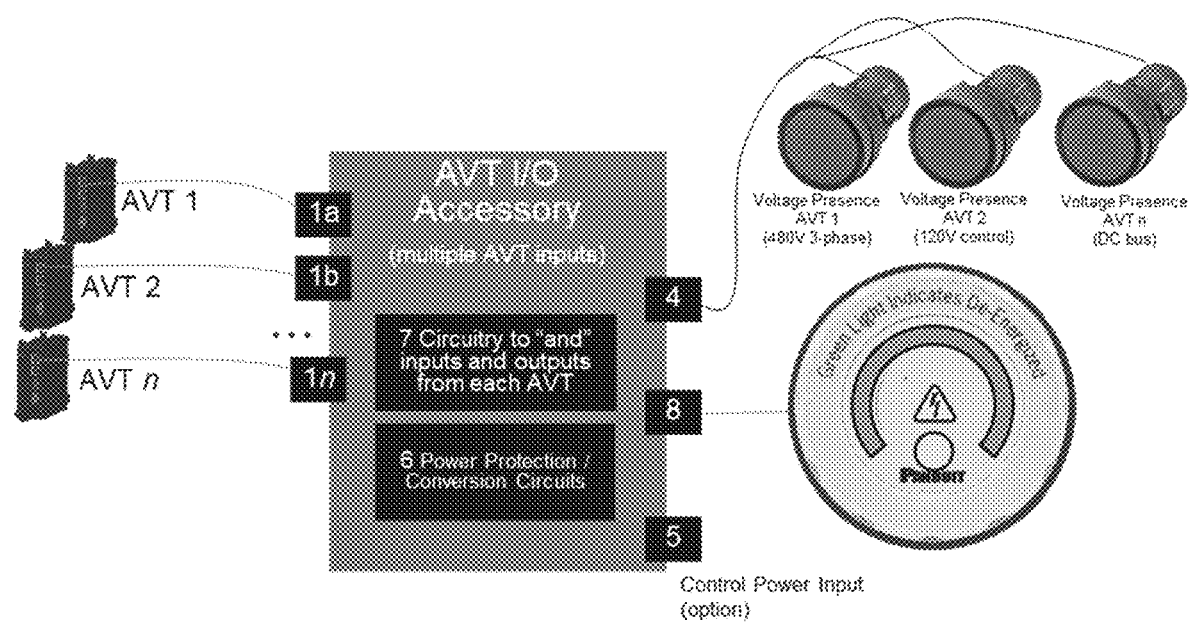
FIG. 13 shows how multiple AVTs can be used with a simplified multi-test point indicator.

The multi-test point indicator display module (FIG. 13), at minimum, has a single input (for example, a pushbutton on the interface) to trigger the test at each location with an AVT present [1a, 1b, 1n] when used with the AVT I/O accessory and an active indicator (ex. Green LED) to show that absence of voltage has been verified for at all inputs. A variation may have additional indicators to show absence of voltage at each of the individual test points. Another variation of the indicator module may include an indicator to show if one or more, or individual AVT test points have voltage present. Each of these signals may be combined in [8] in a single connector, similar to [1a, 1b, 1n], with the accessory acting as a splitter with the addition of logic in [7].

Another way to embody this concept is to enable the multiple AVT input I/O accessory with an interface (such as solid state contacts) for voltage presence. [4] This interface could be "anded" to indicate if voltage is present at any AVT test point, or there could be individual interfaces for each AVT. This interface would be compatible with HMI/webserver/control system interfaces, or pilot lights, stack lights, or any other type of standalone indicators. This may be useful in applications in large control panels where different sources may be accessible behind separate doors or covers or multiple test points in a switchgear or motor control center lineup.

The multiple AVT Input I/O Accessory would utilize a mechanism to determine which ports [1a . . . 1n] are used and unused, so that it would function regardless of how many AVTs are connected to the accessory. This could be done using a toggle or dip switch configured by the user at time of installation for each port. Another way to achieve this functionality is with internal circuitry to detect and verify the presence of each AVT. This could be done with digital processors, hardware, or some combination.

AVTs may contain communications paths that may be utilized by another device in order to transfer data and trigger functionality within the AVT. The Network Module is one such device capable of communicating with the AVT in order to facilitate the transfer of data and information to any number of end points. The Network Module is capable of utilizing the onboard ethernet and wireless (WIFI, Bluetooth LE) physical pathways and any protocol supported on these medium to integrate with other systems. The system is also capable of interfacing with any third party ethernet devices such as cellular endpoints in order to further extend the capabilities of the system.

Other forms of integration of the Verisafe AVT and external endpoints can come in the form of protocol bridges that translate the 2 wire data from the AVT to any number of protocols and physical interfaces. Examples of this outside of the Network Module capabilities are Zigbee or Zwave amongst other wireless and low power wireless systems. The indicator module could also be outfitted with these wireless systems in order to transfer data upon waking while keeping the device low power capable.

Figure 14:
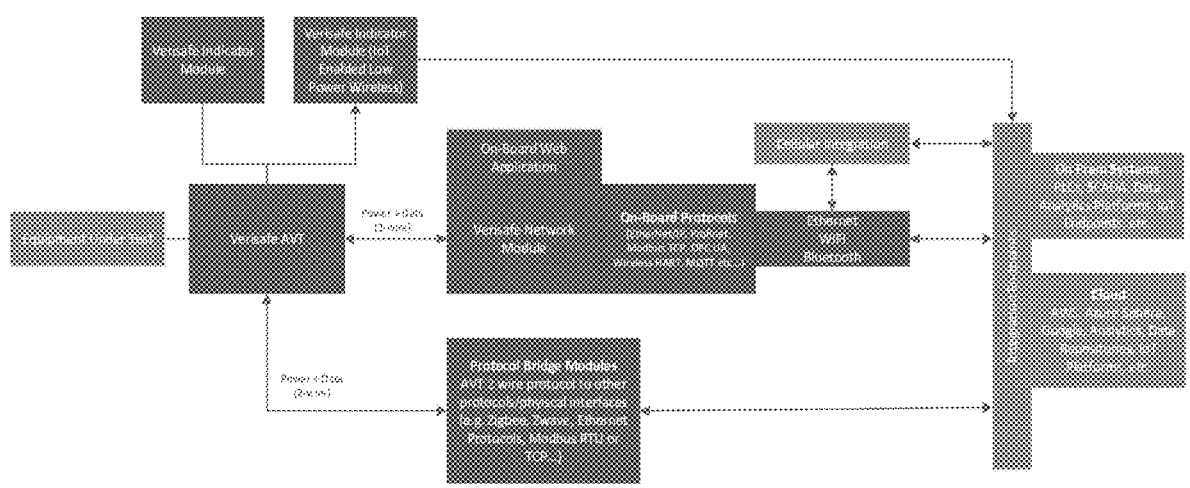
FIG. 14 example AVT integration routes.

The integration routes shown in FIG. 14 are designed to allow flexibility to a number of protocols (examples are shown in the figures, but not all inclusive), depending on the application. This could include safety and security protocols, ethernet protocols, IoT protocols, fieldbus protocols, close-proximity protocols, whether they be wired or wireless, and support communication only or a combination of power and communication.

In addition to the network integration supported by the current product, this could be embodied in a number of ways. For example, currently the network module is a separate entity that interfaces with the AVT isolation module. The communication function could be built directly into the AVT (for example in the isolation module), replacing the network module. Another option is to leverage the indicator module for communication. This is particularly advantageous for wireless protocols, since the isolation module is installed inside an electrical enclosure (typically metal), while the indicator module is mounted externally to the electrical enclosure. Locating the communication interface externally at the indicator module also enables new use cases that leverage proximity to a particular AVT to obtain data from it. Alternatively, a custom hardware interface could be developed to take data from the AVT (isolation or indicator module) direct to the desired endpoint.

It is also possible to use any number of these integration routes to communicate safety data utilizing methods often used in popular safety-based protocols such as CIP Safety and ProfiSafe. These methods enable the transfer of safety related data from the AVT up through the network module and out to other systems.

Communication of safety related data to remote devices could be advantageous for AVT products. An example would be a safety rated controller on an ethernet network which is able to receive a safe indication from an AVT device. One possible way to achieve this with the existing network module (or similar device) would be to take the approach of not making any assumptions about the performance of the communications channel. The IEC 61508 standard allows for this approach (black channel), where the entire communications channel is not developed in adherence to functional safety standards, but instead a safety layer is used on top of an existing "black" communications channel. The idea would create a safety layer on top of the existing network module communications stack to both the AVT base unit and to network connected devices (wired and/or wireless). This layer would ensure the integrity of data from end to end of the communication link. The safety layer for wired and secured networks could consist of CRC checksums along with data inversions sufficient to guarantee that data has not been corrupted to a level sufficient to reach SIL2 or SIL3, which can be proved using mathematical calculations. The safety layer for unsecured networks could consist of a cryptographic component using public and private keys. Data could be encrypted at one end of the communication link and decrypted with the private key on the other end of the link. This would serve to secure data transmissions and also to prove that data received and unencrypted with the private key is correct and unchanged.

Figure 15:
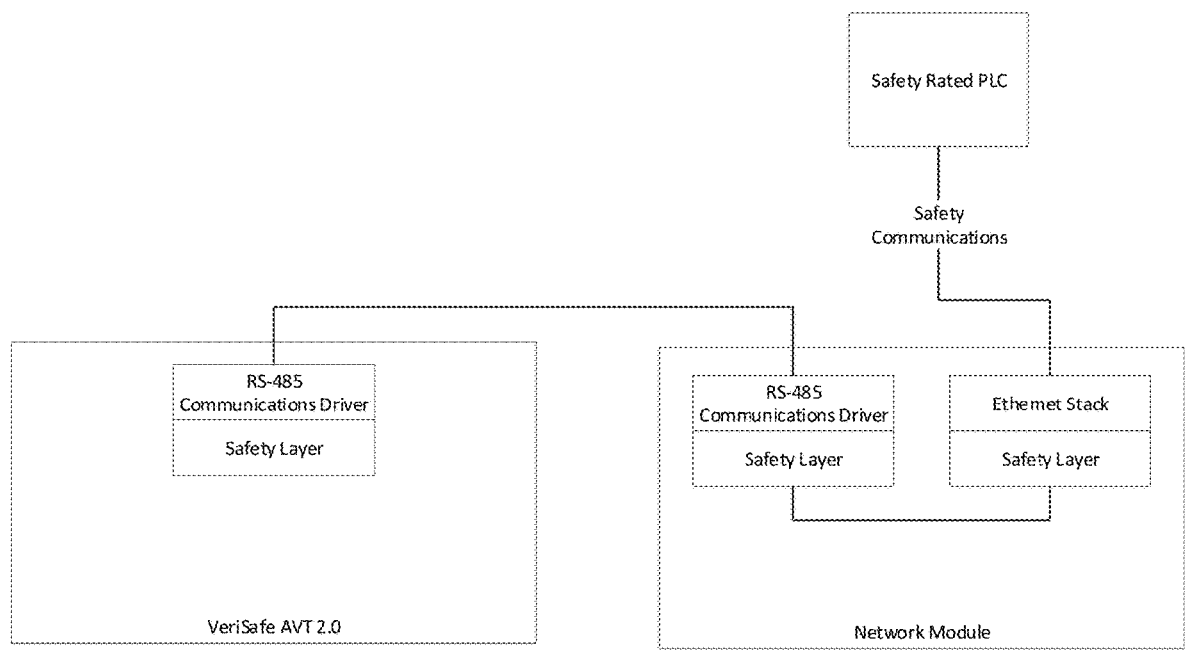
FIG. 15 shows AVT communications with safety layer detail.

Additionally, providing safety-data over the communications interface as shown in FIG. 15 could allow the physical AVT hardware to be simplified (for example eliminating the need for solid state safety contacts), leading to advantages in size, cost, and installation practices.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

The invention claimed is:

1. An absence of voltage detection system comprising:
    an isolation module connected to a voltage source to be detected;
    an I/O accessory module connected to the isolation module wherein the I/O accessory module is configured to allow remote activation of the isolation module; and
    a second isolation module wherein the I/O accessory module is configured to remotely activate both isolation modules.

2. The absence of voltage system of claim 1 wherein the I/O accessory module contains safety contacts.

3. The absence of voltage system of claim 1 wherein the isolation module has safety contacts.

4. The absence of voltage system of claim 1 further comprising a second I/O accessory module wherein a control system is configured control the remote activation of each isolation module via the I/O accessory modules.

* * * * *